US010571297B2

(12) United States Patent
Barnett, Jr. et al.

(10) Patent No.: US 10,571,297 B2
(45) Date of Patent: Feb. 25, 2020

(54) METER COLLAR SYSTEM FOR POWERLINE COMMUNICATION

(71) Applicant: CenturyLink Intellectual Property LLC, Denver, CO (US)

(72) Inventors: Thomas Charles Barnett, Jr., Monroe, LA (US); Michael L. Elford, Calhoun, LA (US)

(73) Assignee: CenturyLink Intellectual Property LLC, Broomfield, CO (US)

( * ) Notice: Subject to any disclaimer, the term of this patent is extended or adjusted under 35 U.S.C. 154(b) by 185 days.

(21) Appl. No.: 15/854,144

(22) Filed: Dec. 26, 2017

(65) Prior Publication Data

US 2018/0188072 A1 Jul. 5, 2018

Related U.S. Application Data

(60) Provisional application No. 62/441,857, filed on Jan. 3, 2017.

(51) Int. Cl.
| | |
|---|---|
| *G01D 4/00* | (2006.01) |
| *G06Q 50/06* | (2012.01) |
| *G01R 22/06* | (2006.01) |
| *H01R 33/90* | (2006.01) |
| *H04B 3/54* | (2006.01) |

(52) U.S. Cl.
CPC .......... *G01D 4/004* (2013.01); *G01R 22/065* (2013.01); *G06Q 50/06* (2013.01); *H01R 33/90* (2013.01); *H04B 3/54* (2013.01); *G01R 22/063* (2013.01)

(58) Field of Classification Search
CPC .......... G01D 4/004; H04B 3/54; G06Q 50/06; H01R 33/90; G01R 22/065; G01R 22/063
USPC ......................................................... 324/110
See application file for complete search history.

(56) References Cited

U.S. PATENT DOCUMENTS

| | | | | |
|---|---|---|---|---|
| 2,063,349 | A * | 12/1936 | Sharp ..................... | G01R 11/04 324/110 |
| 5,940,009 | A * | 8/1999 | Loy ....................... | G01R 22/066 324/110 |
| 6,118,269 | A * | 9/2000 | Davis .................... | G01R 22/065 324/110 |
| 2002/0074990 | A1 * | 6/2002 | Shincovich ............... | H04B 3/54 324/110 |
| 2006/0267575 | A1 * | 11/2006 | Sampson ............ | G08B 13/1427 324/110 |
| 2011/0243157 | A1 * | 10/2011 | Oishi ...................... | H04B 3/54 370/498 |

(Continued)

*Primary Examiner* — Christopher P McAndrew

(57) ABSTRACT

Novel tools and techniques for a meter collar system for powerline communications are provided. The system includes a meter socket coupled to a utility power cable and a supply cable of the customer premises, and a meter collar device coupled to the meter socket. The meter collar device may include a powerline interface coupled to one or more load lines of the subscriber cable, and a line transceiver, coupled to the powerline interface. A physical layer transceiver may be coupled to a subscriber line. The meter collar device may be configured to receive, from the physical layer transceiver, a first data signal from the subscriber line, and convert the first data signal into a powerline data signal for transmission over the one or more load lines, and transmit the powerline data signal, via the line transceiver, over the one or more load lines.

18 Claims, 5 Drawing Sheets

(56) References Cited

U.S. PATENT DOCUMENTS

| | | | |
|---|---|---|---|
| 2013/0007855 A1* | 1/2013 | Bennett | H04B 3/54 726/5 |
| 2013/0163685 A1* | 6/2013 | Yonge, III | H04B 3/542 375/257 |
| 2014/0266389 A1* | 9/2014 | Sadwick | H04B 3/54 327/333 |
| 2018/0335456 A1* | 11/2018 | Cook | G01D 3/08 |

* cited by examiner

METER COLLAR SYSTEM FOR POWERLINE COMMUNICATION

CROSS REFERENCE TO RELATED APPLICATIONS

This application claims priority to U.S. Provisional Patent Application Ser. No. 62/441,857 filed Jan. 3, 2017 by Thomas Charles Barnett Jr. et al., entitled "Method to Use Residential Meter Collar to Deploy Ethernet over Powerline." The disclosures of this application are incorporated herein by reference in its entirety for all purposes.

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to powerline communications, and more particularly to systems for deploying powerline communications over an electric meter collar.

BACKGROUND

The provisioning of data, video, and voice services typically requires access inside a customer premises by a technician and/or installer. Equipment and custom wiring is often needed to provide connectivity within a home. Devices such as residential gateways, modems, routers, and Wi-Fi devices (e.g., routers, modems, access points, and range extenders) are typically installed, in addition to wiring, such as Ethernet cabling, optical fiber, and coax cabling. Thus, service provisioning is time and resource intensive, and requires cooperation with a customer to gain access to the customer premises.

Consumer level powerline communications typically employ an adapter device, coupled to a modem, router, or other network device, to establish network connectivity. The adapter may further be coupled to on-premises electrical wiring used for power distribution (e.g., powerlines and power cables of a customer premises) via an outlet (e.g., socket). The adapter may be powered by the electrical wiring, as well as transmit and receive data over the electrical wiring. However, such systems typically rely on internet and data services to have already been provisioned to the customer premises.

Accordingly, a meter collar system is provided for deploying powerline communications to a customer premises.

BRIEF DESCRIPTION OF THE DRAWINGS

A further understanding of the nature and advantages of the embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF CERTAIN EMBODIMENTS

Figure 1:
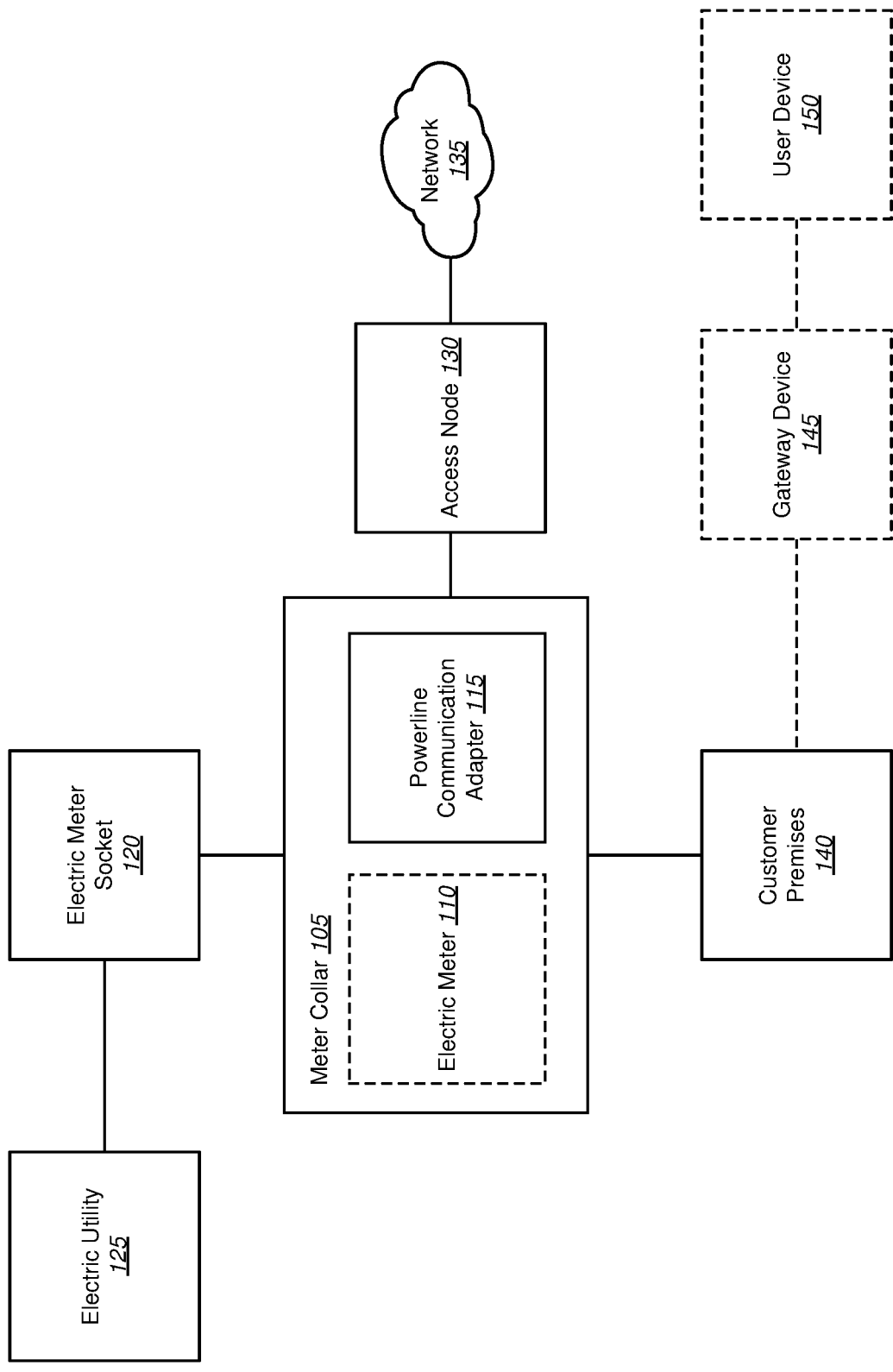
FIG. 1 is a schematic block diagram of a meter collar system for powerline communications, in accordance with various embodiments.

The following detailed description illustrates a few exemplary embodiments in further detail to enable one of skill in the art to practice such embodiments. The described examples are provided for illustrative purposes and are not intended to limit the scope of the invention.

In the following description, for the purposes of explanation, numerous specific details are set forth in order to provide a thorough understanding of the described embodiments. It will be apparent to one skilled in the art, however, that other embodiments of the present may be practiced without some of these specific details. In other instances, certain structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

The various embodiments include, without limitation, methods, systems, and/or software products. Merely by way of example, a method might comprise one or more procedures, any or all of which are executed by a computer system. Correspondingly, an embodiment might provide a computer system configured with instructions to perform one or more procedures in accordance with methods provided by various other embodiments. Similarly, a computer program might comprise a set of instructions that are executable by a computer system (and/or a processor therein) to perform such operations. In many cases, such software programs are encoded on physical, tangible, and/or non-transitory computer readable media (such as, to name but a few examples, optical media, magnetic media, and/or the like).

In an aspect, a meter collar system is provided. The system includes a meter socket, and a meter collar device. The meter socket may be coupled to a utility power cable and a supply cable of the customer premises. The utility power cable may further include one or more utility powerlines and the supply cable may include one or more load lines. The meter collar device may be coupled to the meter socket, and configured to receive a subscriber line. The meter collar device may include a powerline interface coupled to the one or more load lines, and a line transceiver, coupled to the powerline interface, the line transceiver configured to transmit and receive a data signal via the one or more load lines. The meter collar device may further include a physical layer transceiver coupled to the subscriber line, the physical layer transceiver configured to transmit and receive the data signal via the subscriber line. The meter collar device may further include a processor, and a non-transitory computer readable medium communicatively coupled to the processor, the non-transitory computer readable medium having stored thereon computer software comprising a set of instructions that, when executed by the processor, causes the processor to receive, from the physical layer transceiver, a first data signal from the subscriber line. The set of instructions may further be executable to convert the first data signal into a powerline data signal for transmission over the one or more load lines, and transmit the powerline data signal, via the line transceiver, over the one or more load lines.

In another aspect, an apparatus may be provided. The apparatus may include a powerline interface coupled to one or more load lines, a line transceiver, coupled to the powerline interface, the line transceiver configured to transmit and receive a data signal via the one or more load lines, a physical layer transceiver coupled to a subscriber line, the physical layer transceiver configured to transmit and receive the data signal via the subscriber line, a processor, and a non-transitory computer readable medium communicatively coupled to the processor, the non-transitory computer readable medium having stored thereon computer software comprising a set of instructions. The set of instructions may be executable by the processor to receive, from the physical layer transceiver, a first data signal from the subscriber line, convert the first data signal into a powerline data signal for transmission over the one or more load lines, and transmit the powerline data signal, via the line transceiver, over the one or more load lines.

In a further aspect, a method may be provided. The method may include receiving, via a meter collar device, a first data signal from a subscriber line, converting, via the meter collar device, the first data signal to a powerline data signal for transmission over one or more load powerlines, and transmitting, via the meter collar device, the powerline data signal over one or more load powerlines. The method may further include receiving, via the meter collar device, a second data signal from the one or more load powerlines, converting via the meter collar device, the second data signal to a subscriber line data signal, and transmitting, via the meter collar device, the subscriber line data signal over the subscriber line.

Various modifications and additions can be made to the embodiments discussed without departing from the scope of the invention. For example, while the embodiments described above refer to specific features, the scope of this invention also includes embodiments having different combination of features and embodiments that do not include all the above described features.

FIG. 1 is a schematic block diagram of a meter collar system 100 for powerline communications, in accordance with various embodiments. The system 100 may include a meter collar device 105, which may further include an electric meter 110 and powerline communication adapter 115, an electric meter socket 120, electric utility 125, access node 130, network 135, customer premises 140, gateway device 145, and user device 150.

In various embodiments, the meter collar device 105 may include a powerline communication (PLC) adapter 115, and optionally an electric meter 110. The meter collar device 105 may be coupled to an electric meter socket 120. The electric meter socket 120 may, in turn, be configured to receive a line-side (also referred to as utility-side) connection from an electric utility 125. Accordingly, the electric meter socket 120 may be coupled to an electric utility 125. The meter collar 105 may further be coupled to an access node 130. The access node 130 may be coupled to network 135. The meter collar 105 may further be coupled to on-premises electrical wiring (e.g., load-side powerlines and/or power cables) for power distribution to the customer premises 140. Thus, the meter collar 105 may be coupled to the customer premises 140 via the electrical wiring of the customer premises 140. Optionally, a gateway device 145 may further be coupled to the electrical wiring of the customer premises. A user device 145 may further be coupled to the gateway device 145, through which the user device 145 may access network 135, through the connection provided by the meter collar device 105. It should be noted that the system 100 and its components are schematically illustrated in FIG. 1, and that modifications to the system 100 and its architecture may be possible in accordance with various embodiments.

In various embodiments, the meter collar device 105 may be configured to provision a customer premises 140 with network services (e.g., data, voice, and video), via existing electrical wiring (e.g., powerlines) of the customer premises 140. Accordingly, the meter collar device 105 may include a PLC adapter 115. The PLC adapter 115 may be coupled to an access node 130 of a service provider. The access node 130 may be configured manage access to a service provider network, such as network 135. In some embodiments, the access node 130 may be a multiplexer, aggregator, or other or other edge device. For example, access nodes may include, without limitation, a digital subscriber line access multiplexer (DSLAM), cable modem termination system (CMTS), and optical line termination (OLT), or other network device. Thus, network services may be provided to the customer premises 140 via the access node 130. In some embodiments, a service area interface (e.g., outside plant, terminal enclosure, telecom cabinet, standing enclosure, mounted enclosure, underground enclosure, etc.) may be provided between the access node 130 and a demarcation point (e.g., the meter collar device 105) of the customer premises 140. The service area interface may include wiring terminals, repeaters, and other devices for coupling individual subscriber lines of a local loop and/or last mile connection from the access node 130 to the respective customer premises.

Data received from the access node 130 by the PLC adapter 115 may be transmitted, by the PLC adapter 115, over existing, on-premises electrical wiring for the distribution of power to a customer premises 140. On-premises electrical wiring may include both powerlines and power cables coupled to an electric utility via the electric meter socket 120. Accordingly, the PLC adapter 115 may be configured to transmit a data signal, received over the customer's subscriber line (from the access node 130 and/or service area interface), over the electrical wiring of the customer premises 140. The subscriber line may include various types of communication media, including, without limitation, an Ethernet cable (e.g., cat 5, cat 5e, cat 6, etc.), coaxial cable, telephone cables, other twisted pair cables, and optical fiber. Accordingly, in various embodiments, the meter collar 105 may convert data received over the respective communication medium to a signal capable of being transmitted over the electrical wiring of the premises (e.g., powerlines). The meter collar device 105 may, therefore, include one or more interfaces for one or more types of communication media. In yet further embodiments, the PLC adapter 115 may further include a wireless transceiver configured to receive a radio frequency (RF) or other wireless signal (e.g., visible light, line of sight, etc.) and convert the wireless signal into an appropriate wired signal (e.g., optical, Ethernet, Coax, telephone line, or other twisted pair). Accordingly, the transceiver may include, without limitation, a radio such as a hardware radio or a software defined radio, a signal processor, driver, mixers, filters, modulators, and demodulators. The PLC adapter 115 may further include a physical layer transceiver (PHY) for receiving signals, at the physical layer, from a respective communication medium, including the wireless transceiver. For example, the PLC adapter 115 may include an Ethernet PHY for receiving signals via an Ethernet cable, or an Optical PHY for receiving signals from a fiber optic cable. The PHY may be coupled to a PLC chipset configured to convert the data from the PHY to a data signal to be carried over the electrical wiring concurrently with a power signal (which may be an AC or DC signal) from a power supply, such as an electrical grid of the electric utility 125. The PLC chipset may include, without limitation, one or more chips, one or more processors, a system on a chip (SoC), application specific integrated circuit (ASIC), a field programmable gate array (FPGA), or a programmable microcontroller. The PLC chipset may, in some embodiments, include one or more signal processors, including without limitation, a digital-to-analog converter (DAC), analog-to-digital converter (ADC), or a combination of both DAC/ADC. The PLC chipset may further be coupled to a line driver, or line transceiver. The line driver may be configured to amplify the signal from the PLC shipset and drive the signal over the electrical wiring of the customer premises 140.

Similarly, in various embodiments, data received from a user device 150, via the gateway device 145, may be transmitted by the meter collar device 105 to network 135 via access node 130. Gateway device 145 may, in some embodiments, be configured to communicate over powerline (e.g., via the electrical wiring) of the premises. Gateway device 145 may include, without limitation, residential gateways, modems, routers, access points, set top boxes (STB), and voice over internet protocol (VoIP) gateways. User device 150 may be coupled to the gateway device 145, and configured to communicate with the network 135 via the gateway device 145. User device 150 may include, without limitation, smartphones, tablet devices, laptop and desktop computers, streaming media players, smart devices (e.g., smart speakers, smart thermostats, smart appliances, etc.), various internet of things (IoT) devices and sensors, among others. The network 135 may include various types of networks, including, without limitation, an access network, service provider network, a wide area network (WAN), a backbone network, and the internet.

Thus, data signals from the on-premises electrical wiring may be received by the meter collar device 105, via a physical powerline interface. The powerline interface may be configured to couple the meter collar device 105 to the load-side electrical wiring of the customer premises 140 of the electric meter socket 120. Accordingly, the powerline interface may include various electrical connectors, including without limitation, clips, clamps, prongs, plugs, crimps, terminals, screws, punchdowns, quick connects, and splices. The PLC adapter 115 may further be configured to receive, via the powerline interface, a combined signal including both the power signal from the electric utility 125 and a data signal from a user device 150 via the gateway device 145. The PLC adapter 115 may, in some embodiments, include a line transceiver or line receiver. The line transceiver (or line receiver) may be configured to extract a data signal from the electrical wiring of the customer premises 140. Thus, in some examples, the PLC adapter 115 may be configured to separate the data signal from the power signal. In some embodiments, the PLC adapter 115 may further include a low pass filter (LPF), or alternatively a bandpass filter (BPF), configured to filter the power signal from the data signal. In some embodiments, the line transceiver may include the LPF. In further embodiments, the line transceiver may be configured step down the voltage of the data signal from the electrical wiring. Thus, line transceiver may, in some embodiments, include voltage converter circuitry and components, as known to those in the art. The line transceiver, coupled to the PLC chipset, may transmit the voltage converted data signal (e.g., line voltage) to the PLC chipset. The PLC chipset may then be configured convert the data signal to a data signal to be carried over the appropriate communication medium. The PLC chipset may further be configured to transmit the data signal to an appropriate PHY, which may be configured to encode and transmit the data signal over the appropriate physical communication medium of the subscriber line, or in some cases, a wireless signal via the wireless transceiver.

In various embodiments, the wireless transceivers may be configured to utilize various protocols, including, without limitation, IEEE 802.11 protocols (e.g., 802.11ad, 802.11ac, 802.11b/g/n, 802.11ax), Bluetooth, and the like. The wireless transceivers may further be configured to communicate at various frequencies and/or frequency spectrums, such as, without limitation, millimeter wave, 5 GHz, microwave, 2.4 GHz, ultra-high frequency (UHF), very-high frequency (VHF), infrared (IR), and other suitable frequencies.

In some further embodiments, the PLC adapter 115 may be configured to allow the power signal may, from the electric utility 125, to pass through with the data signal filtered out. Accordingly, the PLC adapter 115 may include a pass-through filter, which may include a high pass filter (HPF), or alternatively a BPF, configured to filter data signals that may be on the electrical wiring or powerline. In some examples, the PLC adapter 115 may include a passthrough port. The passthrough port may be a socket or outlet to which a device may be plugged in to receive power. The passthrough port, therefore, may be isolated from receiving, transmitting, or both receiving and transmitting PLC data.

In various embodiments, the meter collar device 105 may further include an optional electric meter 110. The electric meter 110 may include various types of electric meters, as known to those in the art. Accordingly, in some embodiments, the meter collar device 105 may configured to allow an electric meter 110 to receive the electric power supply (e.g., electric utility 125), via the electric meter socket 120.

Thus, the electric collar device 105 may include connectors configured to allow the electric meter 110 to be coupled directly to the electric collar device 105, and receive the power signal from the electric utility 125. In some embodiments, the power signal may first pass through the electric meter 110 before being transmitted to the PLC adapter 115. In an alternative embodiment, the meter collar device 105 may be configured to allow an electric meter 110 to be coupled to the electric power supply (e.g., electric utility 125), via the electric meter socket 120.

The electric meter socket 120 may be configured to receive one or more power cables from the electric utility 125. The power cable may include one or more utility-side powerlines, such as a first line at a first voltage and a neutral line, or in some examples, a first line at a first voltage, a neutral line at ground, and a second line at a second voltage. The electric meter socket 120 may further be configured to allow electrical wiring of a customer premises 140 to be connected to the powerlines of the electric utility 125 to receive electrical power. The electrical wiring from the customer premises 140 may include an incoming supply cable with one or more load powerlines. The one or more load powerlines may include a first load, neutral load, and in some examples, a second load. Accordingly, in various embodiments, the electric meter socket 120 may be configured to allow each of the utility powerlines to be coupled to a respective load powerline. For example, the first line may be coupled to the first load, the neutral line to the neutral load, and the second line to the second load. In some embodiments, an electrical connection may be completed via installation of an electric meter, such as electric meter 110. The electric meter socket 120 may include various electrical connectors (e.g., clips, clamps, plugs, prongs, crimps, terminals, screws, punchdowns, and quick connects) configured to allow the meter collar device 105 and/or an electric meter 110 to be coupled to both the utility powerlines and the load powerlines. Accordingly, the electric meter socket 120 may be configured to provide interface between the customer premises 140 electrical wiring, and the electric utility 125. In various embodiments, the electric utility 125 may include a local distribution node of a respective electric utility provider, such as, without limitation, a transformer box or dropdown transformer.

Figure 2:
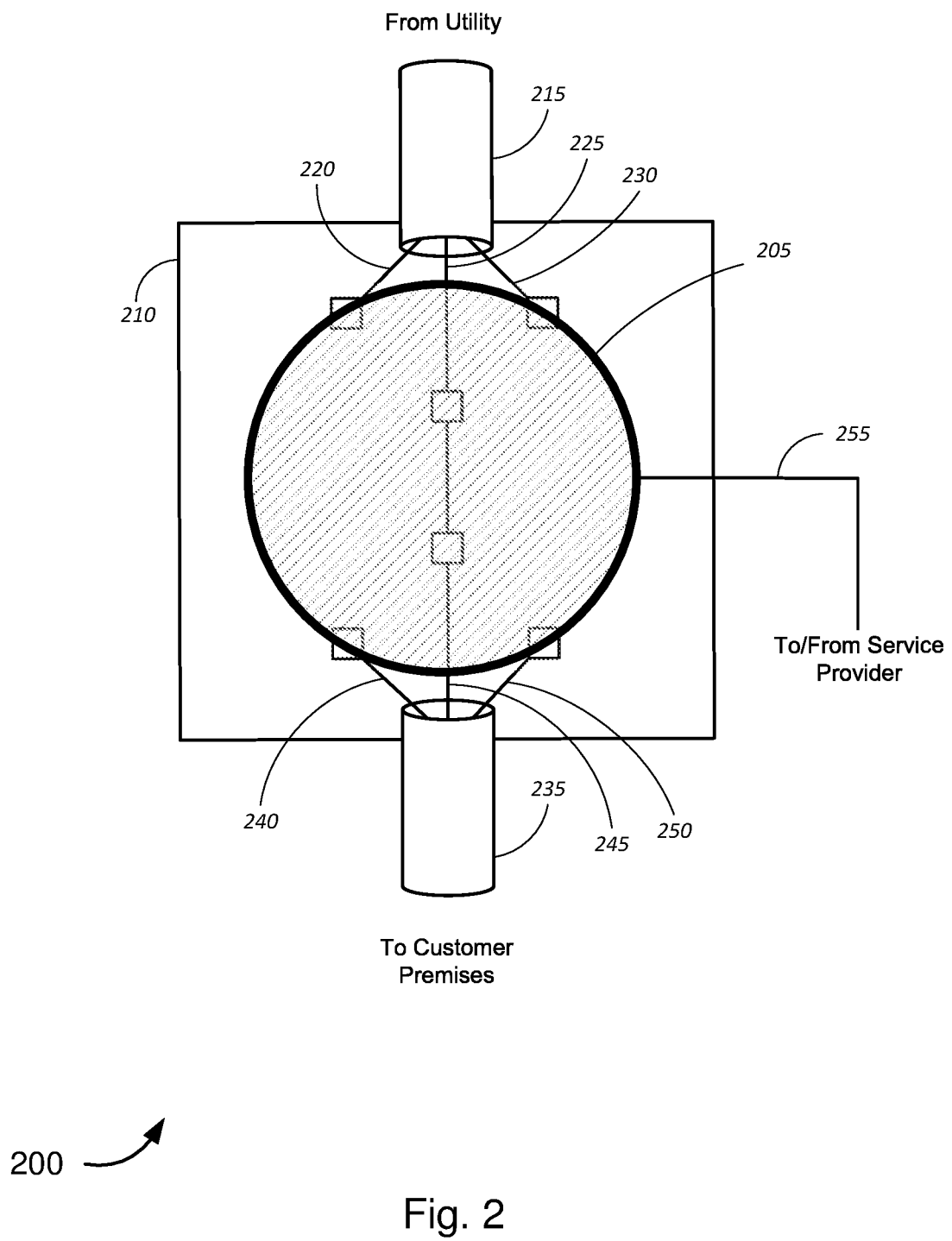
FIG. 2 is a schematic diagram of a meter collar device for powerline communications and a meter socket, in accordance with various embodiments.

FIG. 2 is a schematic diagram of a meter collar assembly 200 over a meter socket, in accordance with various embodiments. The meter collar assembly 200 may include a meter collar device 205, meter socket 210, a utility side power cable 215 with a first utility line 220, neutral utility line 225, and a second utility line 230, a supply cable 235 with a first load line 240, neutral load line 245, and second load line 250, and a subscriber line 255.

In various embodiments, the meter collar device 205 may be configured to be coupled to the meter socket 210. The meter socket 210 may further receive the utility side power cable 215 and couple each of the first utility line 220, neutral utility line 225, and second utility line 230 to a respective coupler (e.g., clip, clamp, plug, prong, crimp, terminal, screw, punchdown, quick connect, etc.). Similarly, the meter socket 210 may also receive a supply cable 235 from the customer premises, and couple each of the first load line 240, neutral load line 245, and second load line 250 to a respective coupler. The meter socket 210 may, in some embodiments, be configured to couple the neutral utility line 225 to the neutral load line 245. The meter collar device 205 may, in some embodiments, be configured to be coupled to the meter socket 210 via one or more of the couplers. In some examples, the meter collar device 205 may further be coupled to one or more of the first utility line 220, neutral utility line 225, and second utility line 230, first load line 240, neutral load line 245, and second load line 250 via the one or more couplers. In some embodiments, the meter collar device 205 may be configured to complete an electrical connection from the first utility line 220 to the first load line 240, and second utility line 230 to the second load line 250. A subscriber line 255 from a network service provider may be coupled to the meter collar device 205, and communicatively coupled to the first load line 240, neutral load line 245, and second load line 250 via the meter collar device 205. It should be noted that the meter collar assembly 200 and its components are schematically illustrated in FIG. 2, and that modifications to the assembly 200 and its architecture may be possible in accordance with various embodiments.

As previously described, in various embodiments, the meter socket 210 may be configured to receive a utility side power cable 215, including one or more utility powerlines. In some embodiments, the one or more utility powerlines may include a first utility line at a first voltage and a neutral utility line at ground, or in some examples, a first utility line 220 at a first voltage, a neutral utility line 225 at ground, and a second utility line 230 at a second voltage. The meter socket 210 may further be configured to allow electrical wiring of a customer premises to be connected to the utility powerlines of the electric utility. The electrical wiring from the customer premises may include an incoming supply cable 235 with one or more load powerlines. The one or more load powerlines may include a first load line, neutral load line, and a second load. Thus, the supply cable 235 may couple the electrical wiring of the customer premises to the electric utility via the utility side power cable 215.

In various embodiments, the meter collar device 205 may be configured to be coupled to the load powerlines of the supply cable 235. As previously described, the meter collar device 205 may be configured to receive data from the service provider, via the subscriber line 255, and transmit data over the electrical wiring of a premises, via the load powerlines, including the first load line 240, neutral load line 245, and second load line 250. The meter collar device 205 may further be configured to receive data from a user device via the load powerlines, and transmit data over the subscriber line 255. Accordingly, various embodiments, the meter collar device 205 may include various physical interfaces for receiving signals over various communication media. The physical interfaces may include, without limitation, a powerline interface configured to couple to the one or more load powerlines of the supply cable 235, via the couplers of the meter socket 210. In further embodiments, the physical interfaces may include interfaces for receiving various types of subscriber line 255, including ports, adapters, and receivers for Ethernet cable, telephone cable, other twisted pair cables, coaxial cable, and optical fiber. In some further embodiments, the meter collar device 205 may be configured to communicate wirelessly with a service provider. Accordingly, in some embodiments, the meter collar device 205 may include a wireless transceiver, in addition or alternative to a physical interface for receiving a wired communication medium. The meter collar device 205 may further include physical layer PHYs, signal processors, line drivers and transceivers, configured to receive and transmit data signals to and/from the electrical wiring (e.g., load powerlines) of the customer premises, as previously described with respect to FIG. 1.

In some further embodiments, the meter collar device 205 may be configured to electrically couple the utility powerlines to the load powerlines. As previously described, the meter collar device 205 may be configured to receive, or in some examples may itself include, an electric meter. The electric meter may be configured to complete the connection from the first utility line 220 to the first load line 240, and the second utility line 230 to the second load line 250. In some examples, the PLC components (e.g., PHYs, signal processors, line drivers and transceivers, etc.) of the meter collar device 205 may be shielded from the utility side powerlines and/or the power signal on both the utility side powerlines and load powerlines. Thus, the meter collar device 205 may be configured to provide a shielded connection to the electrical wiring of the customer premises, including various filters, fuses, and other devices configured to protect the PLC components against electrical surges and high voltages on the powerlines (both on the utility side and load side).

Figure 3:
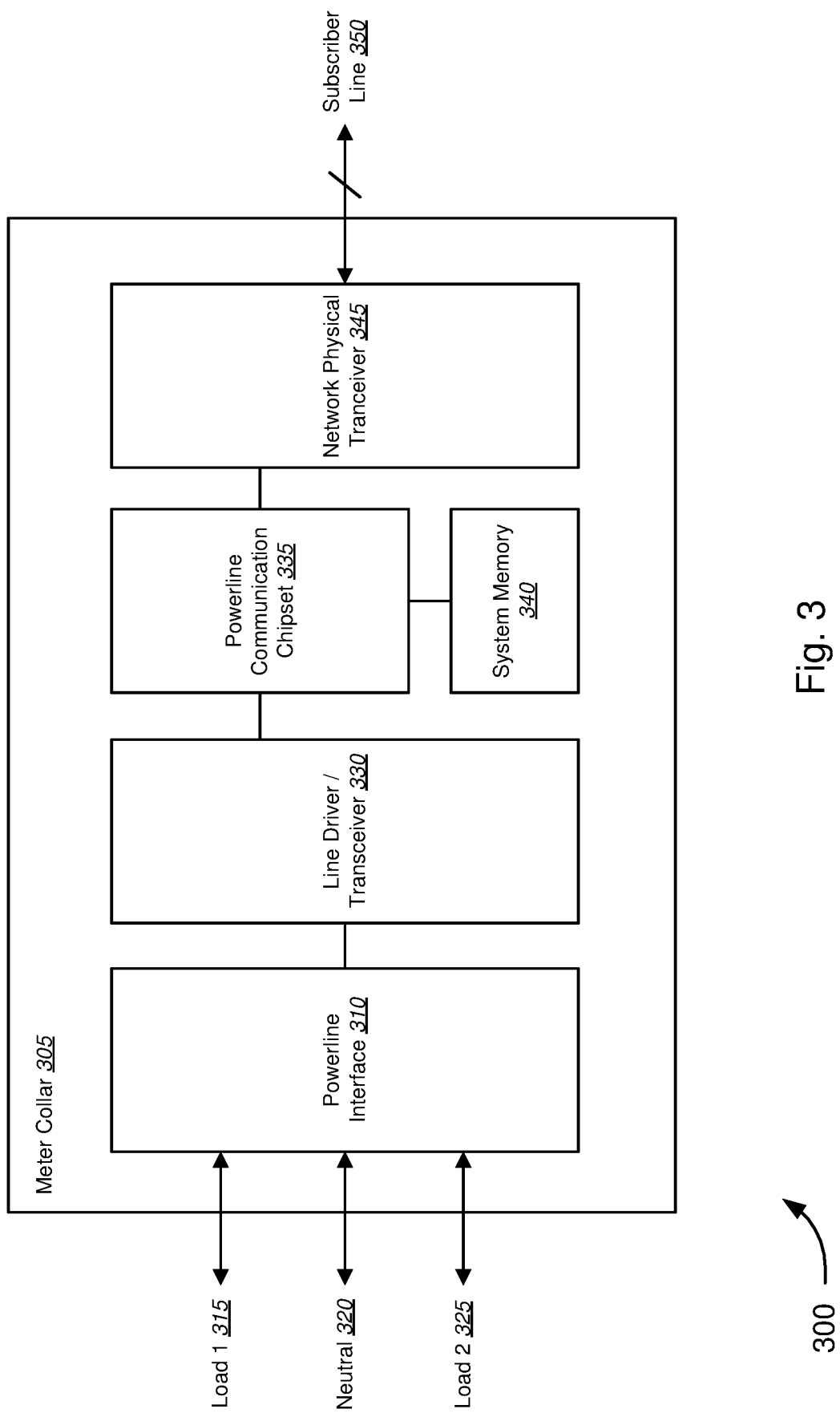
FIG. 3 is a schematic block diagram of a meter collar device for powerline communications, in accordance with various embodiments.

FIG. 3 is a schematic block diagram of a meter collar device 300 for powerline communications, in accordance with various embodiments. The meter collar device 300 may include a meter collar 305 including a powerline interface 310, line driver/transceiver 330, PLC chipset 335, system memory 340, and a network physical transceiver 345. The meter collar device 300 may further include physical input/output (I/O) interfaces (including powerline interface 310) coupled to a first load line "load 1" 315, a neutral load line 320, a second load line "load 2" 325, and one or more subscriber lines 350.

In various embodiments, the powerline interface 310 may be coupled to load 1 315, neutral 320, and load 2 325. The powerline interface 310 may further be coupled to the line driver/transceiver 330. The line driver/transceiver 330 may be coupled to the PLC chipset 335, which may be coupled to system memory 340. The PLC chipset 335 may further be coupled to a network physical transceiver 345. The network physical transceiver may be coupled to the subscriber line 350 over an appropriate physical interface (e.g., an Ethernet port, optical fiber connector, coaxial connector, wireless transceiver, etc.). It should be noted that the meter collar device assembly 300 and its components are schematically illustrated in FIG. 3, and that modifications to the assembly 300 and its architecture may be possible in accordance with various embodiments.

In various embodiments, the powerline interface 310 may be configured to physically receive the load powerlines of a customer premises. The load powerlines may, in turn, be coupled to the electrical wiring of the customer premises. The load powerlines may include load 1 315, which may further be coupled to a first utility powerline at a first voltage, neutral line 320, which may further be coupled to a neutral utility line at ground, and load 2 325, which may further be coupled to a second utility line at a second voltage. As previously described, the powerline interface 310 may various types of electrical connectors, including, without limitation, clips, clamps, prongs, plugs, crimps, terminals, screws, punchdowns, and quick connects. In various embodiments, the powerline interface 310 may further be configured to couple to a respective coupler of an electric meter socket, in some examples securing the meter collar 305 to the electric meter socket.

The powerline interface 310 may then be coupled to a line driver/transceiver 330. In various embodiments, the signal from the powerline interface 310 may include a power signal from the electric utility. Thus, in some embodiments, one or more of the powerline interface 310 and line driver/transceiver 330 may be configured to extract a data signal from the powerlines. In some examples, powerline interface 310 and/or line driver/transceiver 330 may include a filter configured to filter out the power signal. The filter may include, without limitation, an LPF, HPF, BPF, or a combination of filters. In some embodiments, the filter may be a separate element in the chain, between the connection from the powerline interface 310 and the line driver transceiver 330. Accordingly, incoming signals from the powerlines may be filtered by an LPF to extract the data signal.

In various embodiments, the line driver/transceiver 330 may be configured to drive data signals over one or more of the load powerlines 315-325. Accordingly, the line driver/transceiver 330 may be configured to amplify a data signal received from the PLC chipset 335. The line driver/transceiver 330 may further be configured to receive data signals from one or more of the load powerlines 315-325, and transmit the signals to the PLC chipset 335 for further transmission over the subscriber line 350. Accordingly, the line driver/transceiver 330 may be configured to convert the voltage of the data signal from the load powerlines 315-325 to a line voltage level of the PLC chipset 335.

In various embodiments, the PLC chipset 335 may then be configured to manage how data is passed to and from the electrical wiring (e.g., load powerlines 315-325) of the customer premises. For example, a data signal, received from the line driver transceiver 330, may be converted/formatted to be carried over the appropriate communication medium, via a respective PHY (including the network physical transceiver 345). Similarly, the PLC chipset 335 may be configured to convert/format data received from a PHY (including the network physical transceiver 345) to be carried over powerline, including one or more of the load powerlines 315-325. Thus, the PLC chipset 335 may, in some embodiments, include one or more signal processors, including without limitation, a digital-to-analog converter (DAC), analog-to-digital converter (ADC), or a combination of both DAC/ADC.

In further embodiments, the PLC chipset 335 may be configured to implement timing/frequency protocols for handling communications between multiple devices over a shared communication medium, in this case the subscriber line 350 and the electrical wiring of the customer premises (e.g., load powerline 315-325). For example, in some embodiments, the PLC chipset 335 may be configured to implement a SISO communication scheme, while in other embodiments, the PLC chipset may be configured to implement a MIMO communication scheme. In some further embodiments, the PLC chipset may be configured to control line access via various collision avoidance/multiplexing techniques. Accordingly, the PLC chipset 335 may be configured to manage channel access utilizing, without limitation, one or more of time-division multiple access (TDMA), further including contention free transmission opportunities (CFTXOP) and shared transmission opportunities (STXOP), orthogonal frequency-division multiple access (OFDMA), and carrier sense multiple access (CSMA). In yet further embodiments, PLC chipset 335 may further be configured to implement functions for monitoring network traffic and managing quality of service (QoS) policies. For example, the PLC chipset 335 may be configured to prioritize the handling of real-time and streaming content, for applications such as, without limitation, videos, voice applications, and Internet gaming. Accordingly, in some embodiments, system memory 340 may include instructions, executable by the PLC chipset 335 to perform the various functions described above, in addition to bootstrap memory and firmware instructions.

In various embodiments, the PLC chipset 335 may further be configured to transmit the data signal to the network physical transceiver 345. The network physical transceiver may be a PHY, including without limitation, an Ethernet PHY or optical PHY. The network physical transceiver 345 may be configured to encode and transmit the data signal over the appropriate physical communication medium of the subscriber line 350. Accordingly, in some embodiments, the network physical transceiver 345 may be coupled to a physical interface coupled to the subscriber line 350. For example, the physical interface may include, without limitation, an Ethernet interface or an interface for receiving a fiber optic cable.

In some embodiments, the network physical transceiver 345 may include a wireless transceiver configured to wirelessly communicate with a service provider. In various embodiments, the wireless transceiver may be configured to utilize various protocols, including, without limitation, IEEE 802.11 protocols (e.g., 802.11ad, 802.11ac, 802.11b/g/n), Bluetooth, and the like. The wireless transceivers may further be configured to communicate at various frequencies and/or frequency spectrums, such as, without limitation, millimeter wave, 5 GHz, microwave, 2.4 GHz, ultra-high frequency (UHF), very-high frequency (VHF), infrared (IR), and other suitable frequencies. Thus, the network physical transceiver 345 may be configured to encode and transmit a data signal wirelessly to a service provider access point or other access node, and with received data, to receive and decode a wireless signal and transmit the data to the pLC communication chipset 335.

Figure 4:
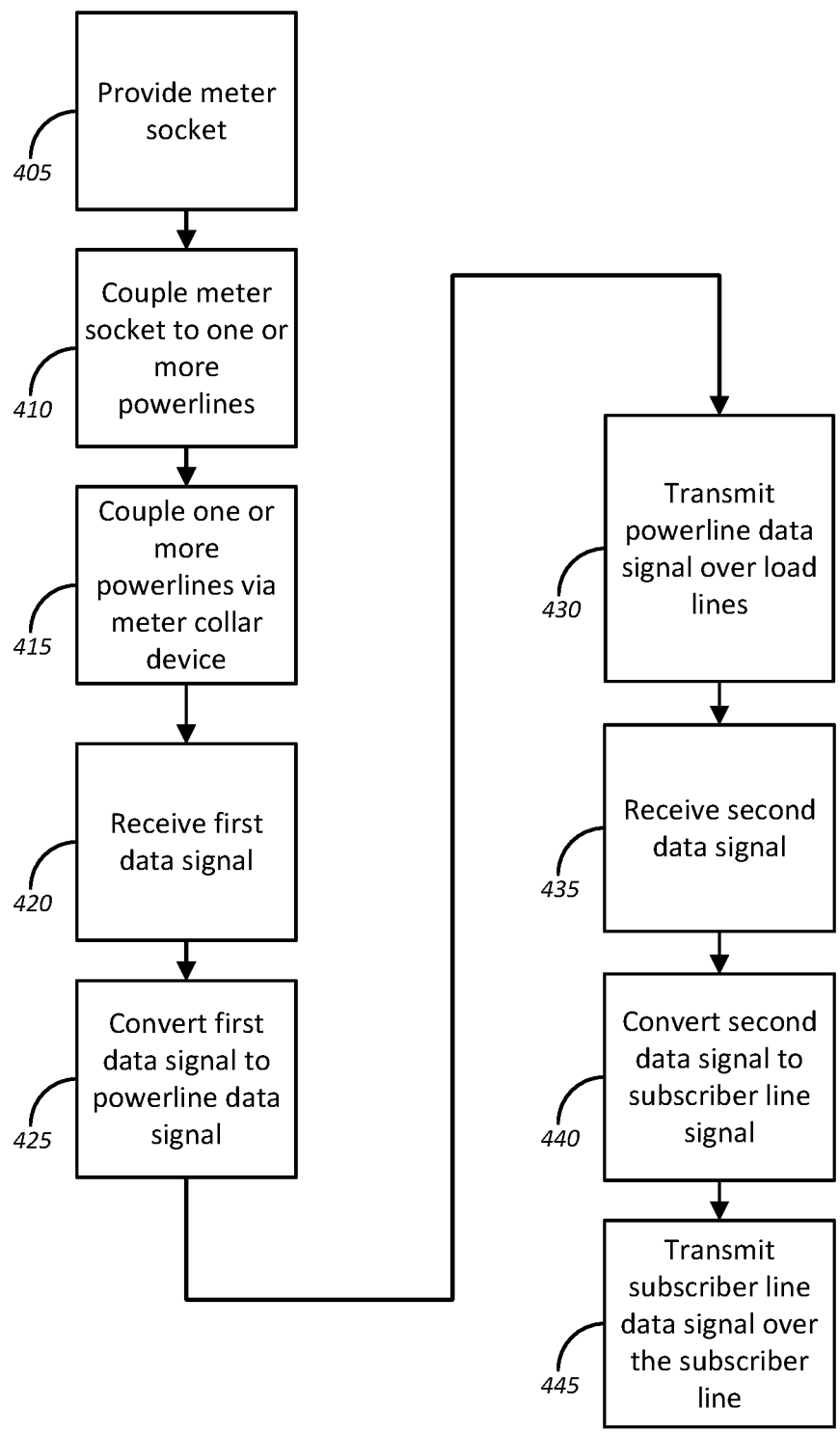
FIG. 4 is a flow diagram of a method of powerline communication using a meter collar device, in accordance with various embodiments.

FIG. 4 is a flow diagram of a method 400 of powerline communication using a meter collar device, in accordance with various embodiments. The method 400 begins, at block 405, by providing a meter socket. As previously described, in various embodiments, the meter socket may be configured to receive one or more power cables. For example, the meter socket may be configured to receive a power cable coupled to an electric utility/grid via a transformer or other distribution device. The meter socket may further be configured to receive a supply cable, coupled to the electrical wiring of a customer premises, for distribution of power to the customer premises.

At block 410, the method 400 continues by coupling the meter socket to one or more powerlines. In various embodiments, the utility power cable may include one or more utility powerlines. As previously described, the utility powerlines may include a first utility line at a first voltage, a neutral utility line at a ground voltage, and a second utility line at a second voltage. The supply cable may further include one or more load powerlines, including a first load line, a neutral load line, and a second load line. Accordingly, in various embodiments, the meter socket may be configured to allow one or more of the utility powerlines and one or more of the load powerlines to be coupled to the meter socket. Couplers may include, for example, clips, clamps, prongs, plugs, crimps, terminals, screws, punchdowns, and quick connects. The meter socket may, in further embodiments, allow the neutral utility line to be coupled to neutral load line.

At block 415, the method 400 continues by coupling the one or more powerlines via a meter collar device. For example, in some embodiments, the meter collar device may be configured to couple one or more of the first utility line to the first load line, and the second utility line to the second load line. In some embodiments, the meter collar device may include, or be coupled to an electric meter. Thus, in some examples, the utility powerlines may be coupled to the load powerlines of the customer premises via the electric meter.

The method 400 continues, at block 420, by receiving a first data signal from a subscriber line, via the meter collar device. In various embodiments, the meter collar device may be configured to receive a subscriber line, and coupled to the subscriber line. A subscriber line may include a wired or wireless connection to a service provider or access node of the service provider. The subscriber line may include various types of communication media, as previously described. For example, subscriber lines may include, without limitation, twisted pair cabling (e.g., Ethernet cable, telephone cable), coaxial, or fiber optic cable. Thus, the meter collar device may be configured to receive a first data signal via the subscriber line. In various embodiments, the first data signal may be a data signal, originating from an outside network, and sent to a device on the customer premises. To receive the first data signal, in some embodiments, the meter collar device may further include a physical interface for the subscriber line and a PHY for receiving and transmitting data over the subscriber line.

At block 425, the first data signal may be converted to a powerline signal. As previously described with respect to other embodiments, the signal from subscriber line may be transmitted by the PHY to a PLC chipset and/or adapter. The PLC chipset or adapter may be configured to convert the data signal, for example a digital signal from the PHY, into a data signal (e.g., powerline signal) to be carried over on-premises electrical wiring via the load powerlines of the customer premises. Thus, in some embodiments, the powerline signal may be an analog signal to be injected and/or mixed with a power signal on the load powerlines of the customer premises.

At block 430, the powerline signal may be transmitted over the load lines. Accordingly, in various embodiments, the meter collar device may further include a line transceiver, line driver, line receiver, or a combination. The powerline signal from the PLC chipset may be provided to the line transceiver. As the line impedance of the load powerlines and electrical wiring of the customer premises often mismatch those of the meter collar device, and line voltages of the meter collar device are much lower than those of the electrical wiring and/or load powerlines, the line transceiver may be configured to amplify (e.g., drive) the powerline data signal to allow the powerline data signal to be transmitted to the electrical wiring of the customer premises.

At block 435, the method 400 may continue by receiving a second signal, with the meter collar device, via the load powerlines of the customer premises. Data transmitted by a user device on the customer premises may be transmitted over the load powerlines. Thus, the second data signal from the user device may be received, via a physical powerline interface of the meter collar device. The physical powerline interface may further be coupled to the line transceiver. In some embodiments, a filter or the line transceiver may extract the second data signal from the power signal on the load powerlines. Typically, the power signal is limited in frequency to 50 or 60 Hz, or in some cases, a DC signal. Accordingly, an LPF or BPF may be configured to filter the power signal.

The method 400 continues, at block 440, by converting the second data signal into a subscriber line signal. While the first data signal was amplified to be driven over the load powerlines, the second data signal, received from the load powerlines, may be voltage converted to a line voltage of the meter collar device and/or PLC chipset. Thus, in various embodiments, the line transceiver may be configured to convert the voltage of the second data signal to the line voltage of the PLC chipset. The PLC chipset may then convert the second data signal into a data signal that may be transmitted over the subscriber line (e.g., a subscriber line data signal). For example, in some embodiments, the second data signal from the load lines may be an analog signal. Thus, the PLC chipset may, in some examples, convert the analog signal to a digital signal to be transmitted over the subscriber line. Once the signal has been converted and/or encoded, the PLC chipset may then transmit the subscriber line data signal to an appropriate PHY of the meter collar device.

At block 445, the method continues by transmitting the subscriber line data signal over the subscriber line. As previously described, the PHY may be configured to transmit data, via a physical subscriber line interface, over the subscriber line. For example, an Ethernet PHY may be configured to transmit the data signal over an Ethernet cable, and an optical PHY may be configured to convert the data signal into an optical signal to be carried over a fiber optic cable. Thus, a respective PHY may be configured to transmit the subscriber line data signal over the appropriate communication medium. In some further embodiments, the communication medium of the subscriber line may be a wireless channel. Accordingly, in some alternative embodiments, the meter collar device may include a wireless transceiver. The PLC chipset may, in turn, be coupled to the wireless transceiver. The wireless transceiver may be configured to transmit the subscriber line data signal wirelessly to an appropriate access point of the service provider.

Figure 5:
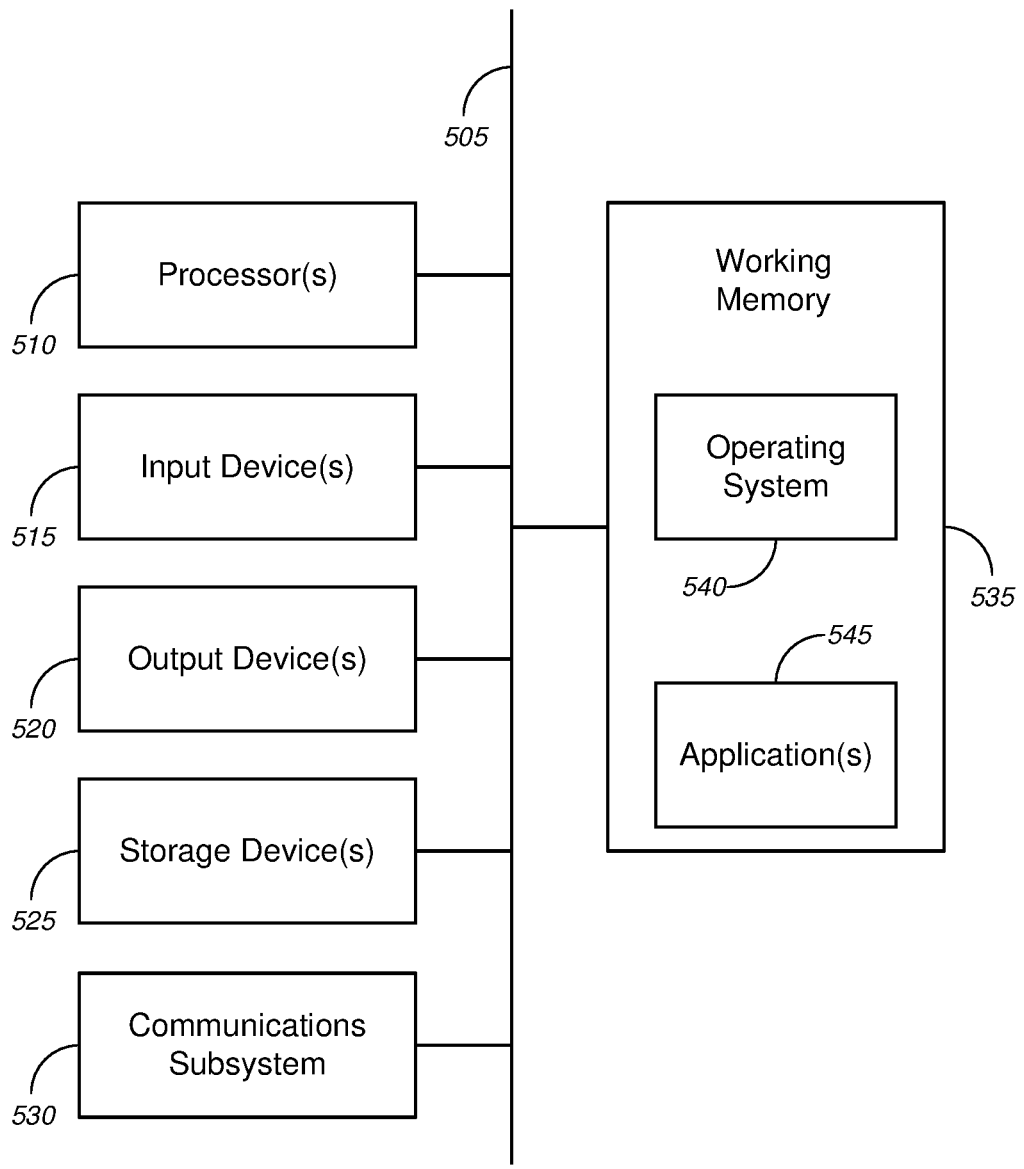
FIG. 5 is a schematic block diagram of a computer system for meter collar system for powerline communications, in accordance with various embodiments.

FIG. 5 is a schematic block diagram of a computer system 500 for meter collar system for powerline communications, in accordance with various embodiments. FIG. 5 provides a schematic illustration of one embodiment of a computer system 500, such as in the meter collar system or device, which may perform the methods provided by various embodiments, as described herein. It should be noted that FIG. 5 only provides a generalized illustration of various components, of which one or more (or none) of each may be utilized as appropriate. FIG. 5, therefore, broadly illustrates how individual system elements may be implemented in a relatively separated or relatively more integrated manner.

The computer system 500—which represents an embodiment of the meter collar device as described above with respect to FIGS. 1-4—includes multiple hardware elements that may be electrically coupled via a bus 505 (or may otherwise be in communication, as appropriate). The hardware elements may include one or more processors 510, including, without limitation, one or more general-purpose processors and/or one or more special-purpose processors (such as microprocessors, digital signal processing chips, graphics acceleration processors, and microcontrollers); one or more input devices 515, which include, without limitation, a mouse, a keyboard, one or more sensors, and/or the like; and one or more output devices 520, which can include, without limitation, a display device, and/or the like.

The computer system 500 may further include (and/or be in communication with) one or more storage devices 525, which can comprise, without limitation, local and/or network accessible storage, and/or can include, without limitation, a disk drive, a drive array, an optical storage device, solid-state storage device such as a random-access memory ("RAM") and/or a read-only memory ("ROM"), which can be programmable, flash-updateable, and/or the like. Such storage devices may be configured to implement any appropriate data stores, including, without limitation, various file systems, database structures, and/or the like.

The computer system 500 might also include a communications subsystem 530, which may include, without limitation, a modem, a network card (wireless or wired), an IR communication device, a wireless communication device and/or chip set (such as a Bluetooth™ device, an 802.11 device, a WiFi device, a WiMax device, a WWAN device, a Z-Wave device, a ZigBee device, cellular communication facilities, etc.), and/or the like. The communications subsystem 530 may permit data to be exchanged with a network (such as the network described below, to name one example), with other computer or hardware systems, between data centers or different cloud platforms, and/or with any other devices described herein. In many embodiments, the computer system 500 further comprises a working memory 535, which can include a RAM or ROM device, as described above.

The computer system 500 also may comprise software elements, shown as being currently located within the working memory 535, including an operating system 540, device drivers, executable libraries, and/or other code, such as one or more application programs 545, and/or may be designed to implement methods, and/or configure systems, provided by other embodiments, as described herein. Merely by way of example, one or more procedures described with respect to the method(s) discussed above might be implemented as code and/or instructions executable by a computer (and/or a processor within a computer); in an aspect, then, such code and/or instructions can be used to configure and/or adapt a general purpose computer (or other device) to perform one or more operations in accordance with the described methods.

A set of these instructions and/or code might be encoded and/or stored on a non-transitory computer readable storage medium, such as the storage device(s) 525 described above. In some cases, the storage medium might be incorporated within a computer system, such as the system 500. In other embodiments, the storage medium might be separate from a computer system (i.e., a removable medium, such as a compact disc, etc.), and/or provided in an installation package, such that the storage medium can be used to program, configure, and/or adapt a general purpose computer with the instructions/code stored thereon. These instructions might take the form of executable code, which is executable by the computer system 500 and/or might take the form of source and/or installable code, which, upon compilation and/or installation on the computer system 500 (e.g., using any of a variety of generally available compilers, installation programs, compression/decompression utilities, etc.) then takes the form of executable code.

It will be apparent to those skilled in the art that substantial variations may be made in accordance with specific requirements. For example, customized hardware (such as programmable logic controllers, single board computers, FPGAs, ASICs, and SoCs) might also be used, and/or particular elements might be implemented in hardware, software (including portable software, such as applets, etc.), or both. Further, connection to other computing devices such as network input/output devices may be employed.

As mentioned above, in one aspect, some embodiments may employ a computer or hardware system (such as the computer system 500) to perform methods in accordance with various embodiments of the invention. According to a set of embodiments, some or all of the procedures of such methods are performed by the computer system 500 in response to processor 510 executing one or more sequences of one or more instructions (which might be incorporated into the operating system 540 and/or other code, such as an application program 545) contained in the working memory 535. Such instructions may be read into the working memory 535 from another computer readable medium, such as one or more of the storage device(s) 525. Merely by way of example, execution of the sequences of instructions contained in the working memory 535 might cause the processor(s) 510 to perform one or more procedures of the methods described herein.

The terms "machine readable medium" and "computer readable medium," as used herein, refer to any medium that participates in providing data that causes a machine to operate in a specific fashion. In an embodiment implemented using the computer system 500, various computer readable media might be involved in providing instructions/code to processor(s) 510 for execution and/or might be used to store and/or carry such instructions/code (e.g., as signals). In many implementations, a computer readable medium is a non-transitory, physical, and/or tangible storage medium. In some embodiments, a computer readable medium may take many forms, including, but not limited to, non-volatile media, volatile media, or the like. Non-volatile media includes, for example, optical and/or magnetic disks, such as the storage device(s) 525. Volatile media includes, without limitation, dynamic memory, such as the working memory 535. In some alternative embodiments, a computer readable medium may take the form of transmission media, which includes, without limitation, coaxial cables, copper wire and fiber optics, including the wires that comprise the bus 505, as well as the various components of the communication subsystem 530 (and/or the media by which the communications subsystem 530 provides communication with other devices). In an alternative set of embodiments, transmission media can also take the form of waves (including, without limitation, radio, acoustic, and/or light waves, such as those generated during radio-wave and infra-red data communications).

Common forms of physical and/or tangible computer readable media include, for example, a floppy disk, a flexible disk, a hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read instructions and/or code.

Various forms of computer readable media may be involved in carrying one or more sequences of one or more instructions to the processor(s) 510 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer system 500. These signals, which might be in the form of electromagnetic signals, acoustic signals, optical signals, and/or the like, are all examples of carrier waves on which instructions can be encoded, in accordance with various embodiments of the invention.

The communications subsystem 530 (and/or components thereof) generally receives the signals, and the bus 505 then might carry the signals (and/or the data, instructions, etc. carried by the signals) to the working memory 535, from which the processor(s) 510 retrieves and executes the instructions. The instructions received by the working memory 535 may optionally be stored on a storage device 525 either before or after execution by the processor(s) 510.

While certain features and aspects have been described with respect to exemplary embodiments, one skilled in the art will recognize that numerous modifications are possible. For example, the methods and processes described herein may be implemented using hardware components, software components, and/or any combination thereof. Further, while various methods and processes described herein may be described with respect to certain structural and/or functional components for ease of description, methods provided by various embodiments are not limited to any single structural and/or functional architecture but instead can be implemented on any suitable hardware, firmware and/or software configuration. Similarly, while certain functionality is ascribed to certain system components, unless the context dictates otherwise, this functionality can be distributed among various other system components in accordance with the several embodiments.

Moreover, while the procedures of the methods and processes described herein are described in sequentially for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a specific structural architecture and/or with respect to one system may be organized in alternative structural architectures and/or incorporated within other described systems. Hence, while various embodiments are described with—or without—certain features for ease of description and to illustrate exemplary aspects of those embodiments, the various components and/or features described herein with respect to one embodiment can be substituted, added and/or subtracted from among other described embodiments, unless the context dictates otherwise. Consequently, although several exemplary embodiments are described above, it will be appreciated that the invention is intended to cover all modifications and equivalents within the scope of the following claims.

What is claimed is:

1. A system comprising:
   a meter socket coupled to a utility power cable and a supply cable of the customer premises, the utility power cable including one or more utility powerlines and the supply cable including one or more load lines;
   a meter collar device coupled to the meter socket, the meter collar device configured to receive a subscriber line, the meter collar device comprising:
   a powerline interface coupled to the one or more load lines;
   a line transceiver, coupled to the powerline interface, the line transceiver configured to transmit and receive a data signal via the one or more load lines;
   a physical layer transceiver coupled to the subscriber line, the physical layer transceiver configured to transmit and receive the data signal via the subscriber line;
   at least one of a low pass filter, bandpass filter, or high pass filter;
   a processor;
   a non-transitory computer readable medium communicatively coupled to the processor, the non-transitory computer readable medium having stored thereon computer software comprising a set of instructions executable by the processor to:

receive, from the physical layer transceiver, a first data signal from the subscriber line;
convert the first data signal into a powerline data signal for transmission over the one or more load lines;
transmit the powerline data signal, via the line transceiver, over the one or more load lines; and
receive, via the line transceiver, a second data signal from the one or more load lines; and
extract the second data signal, from the one or more load lines, wherein extracting the second data signal includes blocking a power signal via the low pass filter or bandpass filter.

2. The system of claim 1, wherein the instructions are further executable by the processor to:
convert the second data signal into a subscriber line signal for transmission over the subscriber line; and
transmit the subscriber line signal, via the physical layer transceiver, over the subscriber line.

3. The system of claim 2, wherein the instructions to convert the second data signal into a subscriber line signal further comprises converting an analog signal into a digital signal.

4. The system of claim 1, wherein the instructions to convert the first data signal into a powerline signal further comprises converting a digital signal to an analog signal.

5. The system of claim 1, wherein the meter collar device further comprises a subscriber line interface for receiving the subscriber line, wherein the subscriber line is one of a twisted pair cable or a fiber optic cable.

6. The system of claim 1, wherein the physical layer interface includes at least one of an Ethernet physical layer interface or an optical physical layer interface.

7. The system of claim 1 further comprising an electric meter, wherein the meter collar device is further configured to receive the electric meter such that the electric meter couples an at least one of the one or more utility powerlines to a respective load line of the one or more load lines.

8. The system of claim 1, wherein the meter collar device further includes a wireless transceiver coupled to the physical layer transceiver, the wireless transceiver configured transmit data received over the one or more load lines wirelessly.

9. The system of claim 1, wherein the instructions are further executable by the processor to:
manage channel access on the one or more load lines, wherein channel access is managed utilizing one of a time division multiple access or frequency-division multiple access.

10. An apparatus comprising:
a powerline interface coupled to one or more load lines;
a line transceiver, coupled to the powerline interface, the line transceiver configured to transmit and receive a data signal via the one or more load lines;
a physical layer transceiver coupled to a subscriber line, the physical layer transceiver configured to transmit and receive the data signal via the subscriber line;
at least one of a low pass filter, bandpass filter, or high pass filter;
a processor;
a non-transitory computer readable medium communicatively coupled to the processor, the non-transitory computer readable medium having stored thereon computer software comprising a set of instructions executable by the processor to:
receive, from the physical layer transceiver, a first data signal from the subscriber line;
convert the first data signal into a powerline data signal for transmission over the one or more load lines;
transmit the powerline data signal, via the line transceiver, over the one or more load lines;
receive, via the line transceiver, a second data signal from the one or more load lines; and
extract the second data signal, from the one or more load lines, wherein extracting the second data signal includes blocking a power signal via the low pass filter or bandpass filter.

11. The apparatus of claim 10, wherein the instructions are further executable by the processor to:
convert the second data signal into a subscriber line signal for transmission over the subscriber line; and
transmit the subscriber line signal, via the physical layer transceiver, over the subscriber line.

12. The apparatus of claim 11, wherein the instructions to convert the second data signal into a subscriber line signal further comprises converting an analog signal into a digital signal.

13. The apparatus of claim 10 further comprising a subscriber line interface for receiving the subscriber line, wherein the subscriber line is one of a twisted pair cable or a fiber optic cable.

14. The apparatus of claim 10 further comprising a wireless transceiver coupled to the physical layer transceiver, the wireless transceiver configured transmit data received over the one or more load lines wirelessly.

15. The apparatus of claim 10, wherein the instructions are further executable by the processor to:
manage channel access on the one or more load lines, wherein channel access is managed utilizing one of a time division multiple access or frequency-division multiple access.

16. A method comprising:
receiving, via a meter collar device, a first data signal from a subscriber line;
converting, via the meter collar device, the first data signal to a powerline data signal for transmission over one or more load powerlines;
transmitting, via the meter collar device, the powerline data signal over one or more load powerlines;
receiving, via the meter collar device, a second data signal from the one or more load powerlines;
extracting, via the meter collar device, the second data signal, from the one or more load lines, wherein extracting the second data signal includes blocking a power signal via a low pass filter or bandpass filter;
converting via the meter collar device, the second data signal to a subscriber line data signal; and
transmitting, via the meter collar device, the subscriber line data signal over the subscriber line.

17. The method of claim 16, wherein converting the first data signal to a powerline data signal includes converting a first analog signal into a first digital signal; and wherein converting the second data signal to a subscriber line data signal includes converting a second digital signal into a second analog signal.

18. The method of claim 16, further comprising:
providing a meter socket;
coupling the meter socket to one or more utility powerlines;
coupling the meter socket to one or more load powerlines; and coupling, via the meter collar device, at least one of the one or more utility powerlines to the one or more load powerlines.

\* \* \* \* \*